US008765544B2

(12) United States Patent
Ito (10) Patent No.: US 8,765,544 B2
(45) Date of Patent: Jul. 1, 2014

(54) FABRICATION OF A SEMICONDUCTOR DEVICE HAVING AN ENHANCED WELL REGION (75) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/604,207

(22) Filed: Sep. 5, 2012

(65) Prior Publication Data
US 2012/0329221 A1    Dec. 27, 2012

Related U.S. Application Data (63) Continuation of application No. 12/814,675, filed on Jun. 14, 2010, now Pat. No. 8,283,722.

(51) Int. Cl.
| H01L 21/04 | (2006.01) |
| H01L 21/8238 | (2006.01) |
| H01L 29/10 | (2006.01) |
| H01L 29/78 | (2006.01) |
| H01L 29/66 | (2006.01) |
| H01L 29/06 | (2006.01) |
| H01L 29/08 | (2006.01) |

(52) U.S. Cl.
CPC .......... *H01L 29/7835* (2013.01); *H01L 29/105* (2013.01); *H01L 29/0653* (2013.01); *H01L 29/66659* (2013.01); *H01L 29/0847* (2013.01); *H01L 29/1045* (2013.01)
USPC ...... 438/217; 438/223; 438/232; 257/E21.04; 257/E21.632

(58) Field of Classification Search
USPC .................... 438/217, 232, 223; 257/E21.04, 257/E21.632
See application file for complete search history.

(56) References Cited

U.S. PATENT DOCUMENTS

| 4,902,639 A | 2/1990 | Ford |
| 5,031,008 A | 7/1991 | Yoshida |
| 5,407,844 A | 4/1995 | Smayling et al. |
| 5,501,996 A | 3/1996 | Yang et al. |
| 5,583,067 A | 12/1996 | Sanchez |
| 5,742,084 A | 4/1998 | Yu |
| 5,801,416 A | 9/1998 | Choi et al. |
| 5,844,275 A | 12/1998 | Kitamura et al. |
| 5,910,673 A | 6/1999 | Hsu et al. |
| 5,918,133 A | 6/1999 | Gardner et al. |
| 5,943,575 A | 8/1999 | Chung |

(Continued)

OTHER PUBLICATIONS

Co-pending, U.S. Appl. No. 13/567,524, ITO, filed Aug. 6, 2012 (Not Published).

*Primary Examiner* — Victor A Mandala
(74) *Attorney, Agent, or Firm* — Sterne, Kessler, Goldstein & Fox P.L.L.C.

(57) ABSTRACT

An apparatus is disclosed to increase a breakdown voltage of a semiconductor device. The semiconductor device includes an enhanced well region to effectively increase a voltage at which punch-through occurs when compared to a conventional semiconductor device. The enhanced well region includes a greater number of excess carriers when compared to a well region of the conventional semiconductor device. These larger number of excess carriers attract more carriers allowing more current to flow through a channel region of the semiconductor device before depleting the enhanced well region of the carriers. As a result, the semiconductor device may accommodate a greater voltage being applied to its drain region before the depletion region of the enhanced well region and a depletion region of a well region surrounding the drain region merge into a single depletion region.

20 Claims, 7 Drawing Sheets

(56) References Cited

U.S. PATENT DOCUMENTS

| | | |
|---|---|---|
| 5,981,997 A | 11/1999 | Kitamura |
| 6,034,388 A | 3/2000 | Brown et al. |
| 6,049,119 A | 4/2000 | Smith |
| 6,077,749 A | 6/2000 | Gardner et al. |
| 6,121,666 A | 9/2000 | Burr |
| 6,172,401 B1 | 1/2001 | Brand |
| 6,177,324 B1 | 1/2001 | Song et al. |
| 6,200,843 B1 | 3/2001 | Bryant et al. |
| 6,204,537 B1 | 3/2001 | Ma |
| 6,211,552 B1 | 4/2001 | Efland et al. |
| 6,242,787 B1 | 6/2001 | Nakayama et al. |
| 6,392,274 B1 | 5/2002 | Tung |
| 6,424,005 B1 | 7/2002 | Tsai et al. |
| 6,441,431 B1 | 8/2002 | Efland et al. |
| 6,465,307 B1 | 10/2002 | Chidambaram et al. |
| 6,548,874 B1 | 4/2003 | Morton et al. |
| 6,580,156 B1 | 6/2003 | Ito et al. |
| 6,620,656 B2 | 9/2003 | Min et al. |
| 6,700,176 B2 | 3/2004 | Ito et al. |
| 6,707,112 B2 | 3/2004 | Kachelmeier |
| 6,724,047 B2 | 4/2004 | Unnikrishnan |
| 6,744,101 B2 | 6/2004 | Long et al. |
| 6,798,684 B2 | 9/2004 | Low et al. |
| 6,876,035 B2 | 4/2005 | Abadeer et al. |
| 6,878,603 B2 | 4/2005 | Bromberger et al. |
| 6,888,205 B2 | 5/2005 | Moscatelli et al. |
| 6,900,101 B2 | 5/2005 | Lin |
| 6,960,819 B2 | 11/2005 | Chen et al. |
| 7,101,764 B2 | 9/2006 | Petti |
| 7,161,213 B2 | 1/2007 | Ito et al. |
| 7,297,582 B2 | 11/2007 | Abadeer et al. |
| 7,345,341 B2 | 3/2008 | Lin et al. |
| 7,348,247 B2 | 3/2008 | Park et al. |
| 7,348,256 B2 | 3/2008 | Miller, Jr. et al. |
| 7,372,104 B2 | 5/2008 | Wu et al. |
| 7,402,855 B2 | 7/2008 | Kurjanowicz |
| 7,405,443 B1 | 7/2008 | Zuniga et al. |
| 7,405,446 B2 | 7/2008 | Agam et al. |
| 7,462,906 B2 | 12/2008 | Lu et al. |
| 7,528,453 B2 | 5/2009 | Holz et al. |
| 7,602,017 B2 | 10/2009 | Cai |
| 7,662,697 B2 | 2/2010 | Ahn et al. |
| 7,821,062 B2 | 10/2010 | Gossner |
| 7,855,144 B2 | 12/2010 | Kim et al. |
| 8,120,106 B2 * | 2/2012 | Hsieh .............. 257/336 |
| 8,148,777 B1 * | 4/2012 | Bulucea .............. 257/335 |
| 2002/0072159 A1 | 6/2002 | Nishibe et al. |
| 2002/0137292 A1 * | 9/2002 | Hossain et al. .............. 438/289 |
| 2003/0127689 A1 | 7/2003 | Hebert |
| 2004/0157379 A1 | 8/2004 | Ito et al. |
| 2005/0052892 A1 | 3/2005 | Low et al. |
| 2005/0127442 A1 | 6/2005 | Veeraraghavan et al. |
| 2005/0196928 A1 | 9/2005 | Bonser et al. |
| 2005/0236666 A1 | 10/2005 | Wang |
| 2006/0124999 A1 | 6/2006 | Pendharkar |
| 2006/0240653 A1 | 10/2006 | Bhattacharyya |
| 2006/0261408 A1 * | 11/2006 | Khemka et al. .............. 257/335 |
| 2006/0289933 A1 | 12/2006 | Gossner |
| 2007/0054464 A1 | 3/2007 | Zhang |
| 2007/0200195 A1 * | 8/2007 | Tanaka et al. .............. 257/492 |
| 2007/0221999 A1 | 9/2007 | Wu et al. |
| 2008/0023760 A1 | 1/2008 | Ito et al. |
| 2008/0023767 A1 | 1/2008 | Voldman |
| 2008/0036033 A1 | 2/2008 | Ito et al. |
| 2008/0054375 A1 | 3/2008 | Williford |
| 2008/0164537 A1 | 7/2008 | Cai |
| 2008/0191291 A1 | 8/2008 | Wu et al. |
| 2008/0246080 A1 | 10/2008 | Ito et al. |
| 2008/0315306 A1 | 12/2008 | Yoo et al. |
| 2009/0032868 A1 | 2/2009 | Chen et al. |
| 2010/0052057 A1 | 3/2010 | Chung et al. |
| 2010/0065909 A1 * | 3/2010 | Ichijo .............. 257/343 |
| 2010/0090278 A1 | 4/2010 | Röhrer |
| 2010/0096697 A1 | 4/2010 | Su et al. |
| 2010/0140699 A1 | 6/2010 | Ko |
| 2010/0295125 A1 | 11/2010 | Ito |
| 2010/0295126 A1 | 11/2010 | Ito |
| 2011/0057271 A1 | 3/2011 | Ito et al. |
| 2011/0169077 A1 | 7/2011 | Ito |
| 2011/0241112 A1 * | 10/2011 | Zuniga .............. 257/343 |
| 2011/0303978 A1 | 12/2011 | Ito |
| 2012/0091525 A1 | 4/2012 | Ito |
| 2012/0161233 A1 | 6/2012 | Ito |

\* cited by examiner

FABRICATION OF A SEMICONDUCTOR DEVICE HAVING AN ENHANCED WELL REGION

CROSS-REFERENCE TO RELATED APPLICATIONS

The present application is a continuation of U.S. patent application Ser. No. 12/814,675, filed Jun. 14, 2010, which is incorporated herein by reference in its entirety.

FIELD OF THE INVENTION

The present invention generally relates to semiconductors. More specifically, the invention relates to increasing a breakdown voltage of a semiconductor device.

BACKGROUND OF THE INVENTION

Silicon semiconductor processing has evolved sophisticated operations for fabricating integrated circuits. As advancement in fabrication process technology continues, the operating voltage of the integrated circuits has decreased, but the operating voltage of auxiliary devices remains the same. Auxiliary devices are devices used in conjunction with integrated circuits and may include printers, scanners, disk drives, tape drives, microphones, speakers, and cameras to provide some examples.

Auxiliary devices may operate at voltages above the breakdown voltage of the transistors contained within the integrated circuit. As the operating voltage applied to a transistor increases, the transistor will eventually breakdown allowing an uncontrollable increase in current to pass through the junction. Breakdown voltage is the voltage level where this uncontrollable increase in current occurs. Examples of breakdown may it include punch-through, avalanche breakdown, and gate oxide breakdown to provide some examples. Operating above the breakdown voltage for a significant duration reduces the lifetime of the transistor.

Techniques are currently available to increase the voltage at which breakdown occurs. These techniques may include the separate design of input-output circuits using a high voltage process, double diffused drain or other extended drain techniques, or the cascading of two individual transistors to provide some examples. These techniques often increase the fabrication cost by requiring additional process steps along with additional substrate masking.

What is needed is a metal oxide semiconductor field effect transistor (MOSFET) device that addresses one or more of the aforementioned shortcomings of conventional MOSFET devices.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner. Likewise, particular bit values of "0" or "1" (and representative voltage values) are used in illustrative examples provided herein to represent information for purposes of illustration only. Information described herein may be represented by either bit value (and by alternative voltage values), and embodiments described herein may be configured to operate on either bit value (and any representative voltage value), as would be understood by persons skilled in the relevant art(s). It should be understood that relative spatial descriptions between one or more particular features, structures, or characteristics (e.g., "vertically aligned," "contact," etc.) used herein are for purposes of illustration only, and that practical implementations of the structures described herein may include fabrication and/or misalignment tolerances without departing from the spirit and scope of the present invention.

The example embodiments described herein are provided for illustrative purposes, and are not limiting. Further structural and operational embodiments, including modifications/ alterations, will become apparent to persons skilled in the relevant art(s) from the teachings herein.

A Conventional Laterally Diffused Metal Oxide Semiconductor (LDMOS) Structure

Figure 1A:
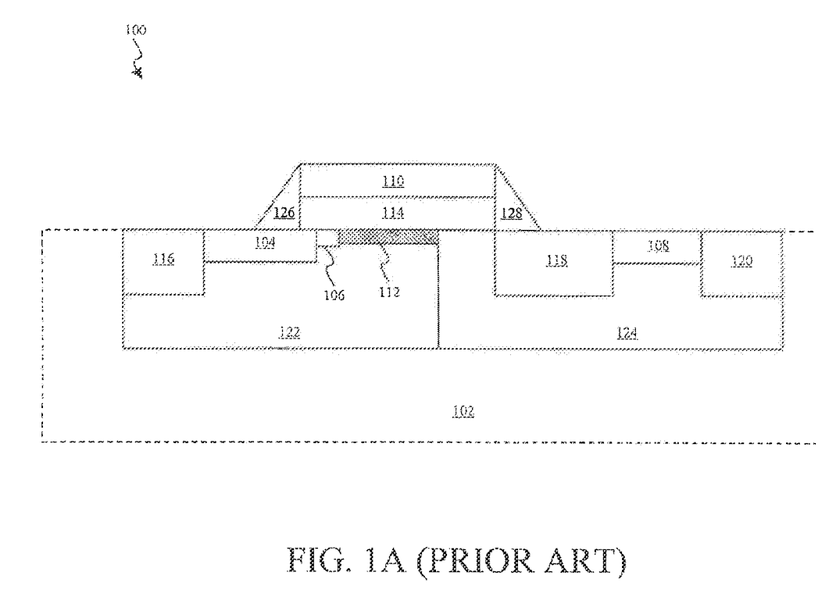
FIG. 1A illustrates a cross-sectional view of a conventional n-type laterally diffused metal oxide semiconductor (LDMOS) fabricated using a conventional complementary metal oxide semiconductor (CMOS) logic foundry technology.

FIG. 1A illustrates a cross-sectional view of a conventional n-type laterally diffused metal oxide semiconductor (LDMOS) fabricated using a conventional complementary metal oxide semiconductor (CMOS) logic foundry technology. A conventional LDMOS structure 100 is formed onto a substrate 102 of a first conductivity type. The substrate 102 represents a physical material on which the conventional LDMOS structure 100 is formed. For example, the conventional LDMOS structure 100 may be formed onto the substrate 102 composed of a p-type material. The p-type material includes impurity atoms of an acceptor type, such as, but not limited to, boron or aluminum to provide some examples, that are capable of accepting an electron. Doping the substrate 102 with the p-type material causes a carrier hole density in the substrate 102 to exceed a carrier electron density.

A first heavily doped region of a second conductivity type, opposite to the first conductivity type, represents a source region 104 of the conventional LDMOS structure 100. Generally, implanting a comparatively small number of atoms, approximately $$\frac{5 \times 10^{18}}{cm^3} \text{ to } \frac{1 \times 10^{19}}{cm^3}$$

refers to an implant that is low or light. Similarly, implanting a comparatively large number of atoms, approximately $$\frac{1 \times 10^{19}}{cm^3} \text{ to } \frac{5 \times 10^{20}}{cm^3},$$

refers to an implant that is high or heavy. The source region 104 may optionally include a lightly doped region, often referred to as an LDD region 106. The LDD region 106 is of substantially similar conductivity as the source region 104 with a lesser doping density when compared to a doping density of the source region 104.

A second heavily doped region of the second conductivity type represents a drain region 108 of the conventional LDMOS structure 100. The source region 104 and the drain region 108 are implanted with N+ material to form a first N+ region and a second N+ region corresponding to the source region 104 and the drain region 108, respectively. The "+" indicates that the region is implanted with a higher carrier concentration than a region not designated by a "+." For instance, an N+ region generally has a greater number of excess carrier electrons than an n-type region. A P+ region typically has a greater number of excess carrier holes than a p-type substrate. The n-type material includes impurity atoms of a donor type, such as, but not limited to, phosphorus, arsenic, or antimony to provide some examples, that are capable of donating an electron. Implanting the source region 104 and the drain region 108 with the n-type material causes the carrier electron density in the source region 104 and the drain region 108 to exceed a carrier hole density.

A third heavily doped region of the second conductivity type represents a gate region 110 of the conventional LDMOS structure 100. A polycrystalline silicon is implanted with the second conductivity type to four the gate region 110. For example, the polycrystalline silicon is implanted with the N+ material to form a third N+ region corresponding to the gate region 110.

The conventional LDMOS structure 100 optionally includes shallow trench isolation (STI) regions to provide isolation and/or protection for the conventional LDMOS structure 100 from neighboring active and passive elements integrated with or deposited on the substrate 102. A first STI region 116 and a second STI region 120 provides isolation and protection for the conventional LDMOS structure 100. The conventional LDMOS structure 100 further includes a breakdown STI region 118 to increase a breakdown voltage of the conventional LDMOS structure 100 when compared to a similar LDMOS structure that does not include the breakdown STI region 118. The breakdown STI region 118, and/or the second STI region 120 are fabricated with a dielectric material such as $SiO_2$, though any suitable material may be used.

The conventional LDMOS structure 100 optionally includes spacers to provide isolation and/or protection between the source region 104, the drain region 108, and the gate region 110. The conventional LDMOS structure 100 includes a first spacer 126 and a second spacer 128 between the source region 104 and the drain region 108, respectively, and the gate region 110. The first spacer 126 and the second spacer 128 are fabricated using a dielectric material, such as $SiO_2$, though any suitable material may be used.

Specially implanted regions, known as wells, may increase the number of carrier holes and/or carrier electrons located in the substrate 102. A specially implanted p-type region, known as a p-well region 122, extends from the first STI region 116 the gate region 110 to increase the number of carrier holes within the substrate 102. The substrate 102 is implanted with the p-type material to fabricate the p-well region 122. Likewise, a specially implanted n-type region, known as an n-well region 124, extends from the second STI region 120 to the gate region 110 to increase the number of carrier electrons within the substrate 102. The substrate 102 is implanted with the n-type material to fabricate the n-well region 124.

The conventional LDMOS structure 100 is fabricated using a conventional CMOS logic foundry technology. The conventional CMOS logic foundry technology accommodates a minimum size, such as a length, width, and/or height the regions of the conventional LDMOS structure 100 and/or a minimum distance between two or more of the regions as defined by one or more minimum design rules (MDRs), such a minimum space interval or a minimum overlap area to provide some examples. These minimum design rules represent limits to the resolution of processing used by the conventional CMOS logic foundry technology, such a minimum space interval between one or more photolithographic masks used to manufacture the conventional LDMOS structure 100. The conventional CMOS logic foundry technology includes a first set of minimum design rules corresponding to a low voltage operating process commonly used to fabricate lower power devices. Alternatively, the conventional CMOS logic foundry technology includes a second set of minimum design rules corresponding to a high voltage operating process commonly used to fabricate higher power devices. The conventional CMOS logic foundry technology fabricates the conventional LDMOS structure 100, in its entirety, using either the low voltage operating process or the high voltage operating process.

Doping Profile of the P-Well Region

Figure 1B:
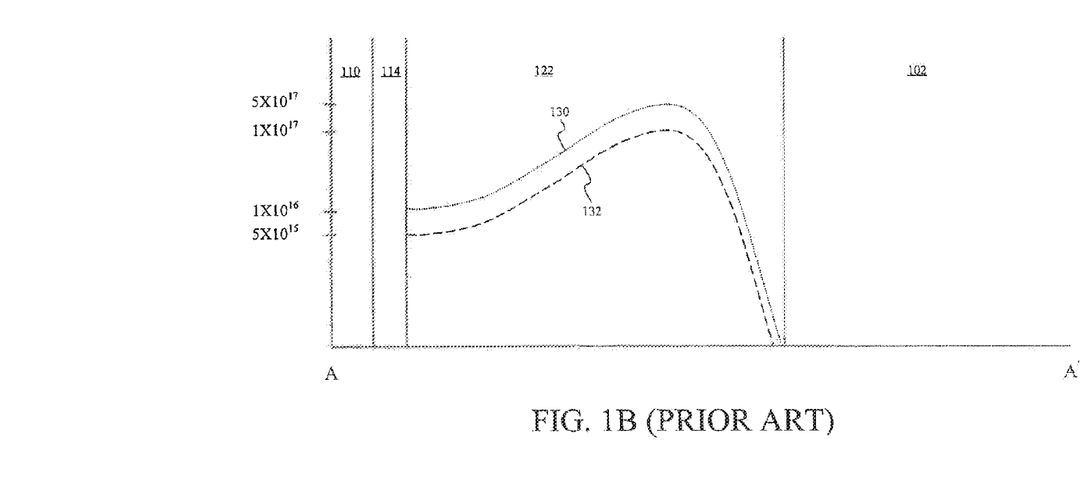
FIG. 1B illustrates a first doping profile of a p-well region formed within the conventional n-type LDMOS.

FIG. 1B illustrates a first doping profile of a p-well region formed within the conventional n-type LDMOS. In particular, FIG. 1B illustrates the doping profile of the p-well region 122 along a cross section of the conventional LDMOS structure 100 designated by the broken line A-A'. As shown in FIG. 1B, the broken line A-A' passes through the gate region 110, the gate oxide 114, the p-well region 122, and the substrate 102.

The conventional CMOS logic foundry technology may implant the substrate 102 solely with a high energy implant of the low voltage operating process to provide a doping profile 130 for the p-well region 122. The high energy implant of the low voltage operating process has a doping density between approximately $$\frac{3 \times 10^{15} \text{ atoms}}{\text{cm}^3}$$

and approximately $$\frac{3 \times 10^{18} \text{ atoms}}{\text{cm}^3}$$

to form the p-well region 122. Alternatively, the conventional CMOS logic foundry technology may implant the substrate 102 solely with a high energy implant of the high voltage operating process to provide a doping profile 132 for the p-well region 122. The high energy implant of the high voltage operating process has a doping density between approximately $$\frac{2 \times 10^{15} \text{ atoms}}{\text{cm}^3}$$

and approximately $$\frac{2 \times 10^{18} \text{ atoms}}{\text{cm}^3}$$

to form the p-well region 122.

Figure 1C:
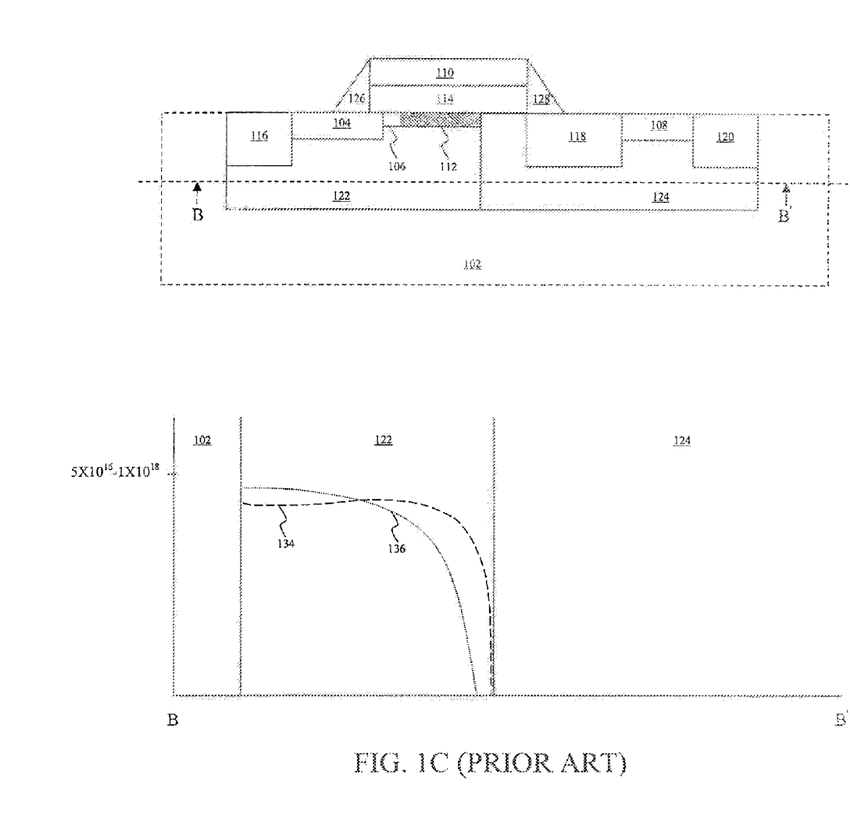
FIG. 1C illustrates a second doping profile of the p-well region formed within the conventional n-type LDMOS.

FIG. 1C illustrates a second doping profile of the p-well region formed within the conventional n-type LDMOS. In particular, FIG. 1C illustrates the doping profile of the p-well region 122 along a cross section of the conventional n-type LDMOS structure designated by the broken line B-B'. As shown in FIG. 1C, the broken line B-B' passes through the substrate 102, the p-well region 122, and the n-well region 124.

The conventional CMOS logic foundry technology may implant the substrate 102 solely with the high energy implant of the low voltage operating process to provide a doping profile 134 for the p-well region 122. Alternatively, the conventional CMOS logic foundry technology may implant the substrate 102 solely with a high energy implant of the high voltage operating process to provide a doping profile 136 for the p-well region 122.

Operation of the Conventional LDMOS Structure

Referring back to FIG. 1A, applying a first potential, such as a positive direct current (DC) voltage to provide an example, to the gate region 110 and applying a second potential, such as a ground potential to provide an example, to the source region 104 causes a voltage to appear between the gate region 110 and the source region 104. The first potential on the gate region 110 repels the positively charged carrier holes from a bottom side of the gate region 110 forming a channel region 112. The channel region 112 represents a carrier-depletion region populated by a negative charge formed at a bottom side of a gate oxide 114 by an electric field. This electric field also attracts carrier electrons from the source region 104 and the drain region 108 into the channel region 112. An n-type region connecting the source region 104 to the drain region 108 forms after a sufficient number of carrier electrons have accumulated in the channel region 112 allowing a current to pass through the channel region 112 from the drain region 108.

Breakdown Voltage of the Conventional LDMOS Structure

There is a point, known as the breakdown voltage, where the current passing through the channel region 112 increases uncontrollably resulting in breakdown of the conventional LDMOS structure 100. Examples of breakdown may include avalanche breakdown, punch-through, or gate oxide breakdown to provide some examples. Punch-through occurs when a voltage on the drain region 108 is increased to the point that causes the depletion region of the n-well region 124 surrounding the drain region 108 to extend through the channel 112 to the depletion region of the p-well region 122 surrounding the source region 104 causing a rapid increase in current. More specifically, as the voltage on the drain region 108 increases, the depletion region of the n-well region 124 and the depletion of the p-well region 122 increase, thereby decreasing the channel region 112. Eventually, the voltage on the drain region 108 increases until the depletion region of the n-well region 124 and the depletion of the p-well region 122 merge into a single depletion region. At this voltage, the channel region 112 no longer exists. The electric field under the gate region 110 effectively becomes dependent upon a voltage from the drain region 108 to the source region 104.

Figure 2A:
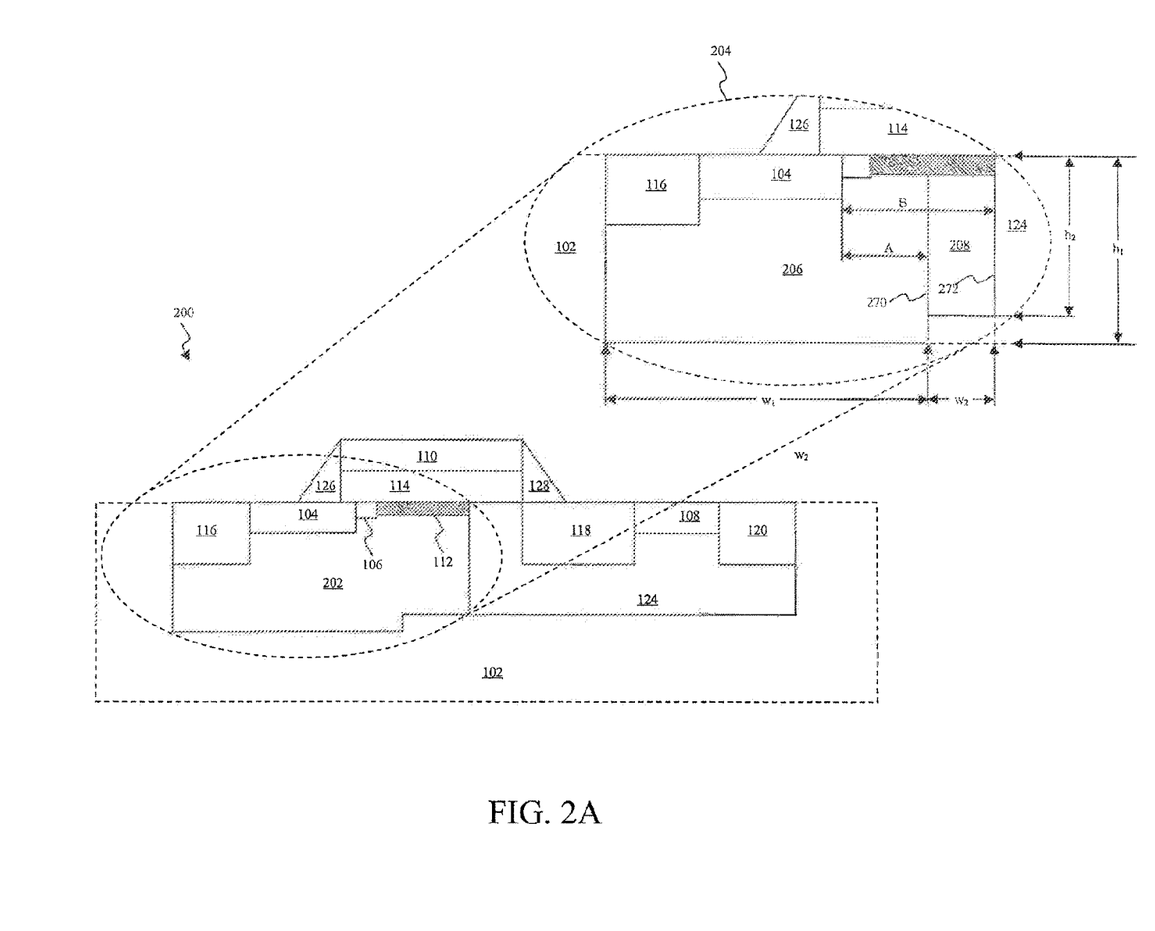
FIG. 2A illustrates a cross-sectional view of an n-type LDMOS structure fabricated using a CMOS logic foundry technology according to an exemplary embodiment of the present invention.

An N-Type Laterally Diffused Metal Oxide Semiconductor (LDMOS) Structure According to an Exemplary Embodiment of the Present Invention FIG. 2A illustrates a cross-sectional view of an n-type LDMOS structure fabricated using a CMOS logic foundry technology according to an exemplary embodiment of the present invention. An n-type LDMOS structure 200 has some similar features to the conventional LDMOS structure 100 as described above. Therefore, only differences between the n-type LDMOS structure 200 and the conventional LDMOS structure 100 are to be described in further detail.

The n-type LDMOS structure 200 may be characterized as including a higher voltage at which punch-through occurs when compared to the conventional LDMOS structure 100. In particular, the n-type LDMOS structure 200 may accommodate a greater voltage being applied to the drain region 108 before the depletion region of the n-well region 124 and the depletion region of an enhanced p-well region 202 merge into a single depletion region.

As shown in an exploded view 204 of FIG. 2A, the enhanced p-well region 202 includes a first p-well region portion 206 and a second p-well region portion 208. The first p-well region portion 206 may be characterized as including a width $w_1$ and a height $h_1$. The width $w_1$ and the height $h_1$ represents a horizontal distance and a vertical distance, respectively, of the first p-well region 206. Similarly, the second p-well region portion 208 may be characterized as including a width $w_2$ and a height $h_2$. The width $w_2$ and height $h_2$ represents a horizontal distance and a vertical distance, respectively, of the second p-well region portion 208. Although the height $h_1$ is shown as being less than the height $h_2$, this is for illustrative purposes only; those skilled in the relevant art(s) will recognize that the height $h_1$ may be greater than the height $h_2$ or the height $h_1$ may be equal to the height $h_2$ without departing from the spirit and scope of the present invention.

As additionally shown in the exploded view 204 of FIG. 2A, the first p-well region portion 206 and the second p-well region portion 208 are offset from the source region 104 by a distance A and a distance B, respectively. The distance A represents a horizontal distance from the source region 104 from to a side 270 of the first p-well region portion 206. Likewise, the distance B represents a horizontal distance from the source region 104 from to a side 272 of the second p-well region portion 208. The first p-well region portion 206 and the second p-well region portion 208 may be characterized as being offset from each other by a difference between the distance A and the distance B, namely B-A. In an exemplary embodiment, the distance A and the distance B are selected such that a ratio of A to B is between:

$$0.2 < \frac{A}{B} \le 1. \tag{1}$$

The n-type LDMOS structure 200 may be formed using a complementary metal oxide silicon (CMOS) logic foundry technology. The CMOS logic foundry technology may include one or more minimum design rules corresponding to one or more operating voltages. The minimum design rules represent minimum sizes of components of n-type LDMOS structure 200 and/or distances between the components of the n-type LDMOS structure 200 in accordance with the CMOS logic foundry. The CMOS logic foundry technology may include a specialized set of minimum design rules, such as a first set of minimum design rules for a low operating voltage process and/or a second set of minimum design rules for a high operating voltage process to provide some examples, for a corresponding operating voltage. The CMOS logic foundry technology fabricates the n-type LDMOS structure 200 using fabrication technologies from both the low operating voltage process and the high operating voltage process.

Figure 2B:
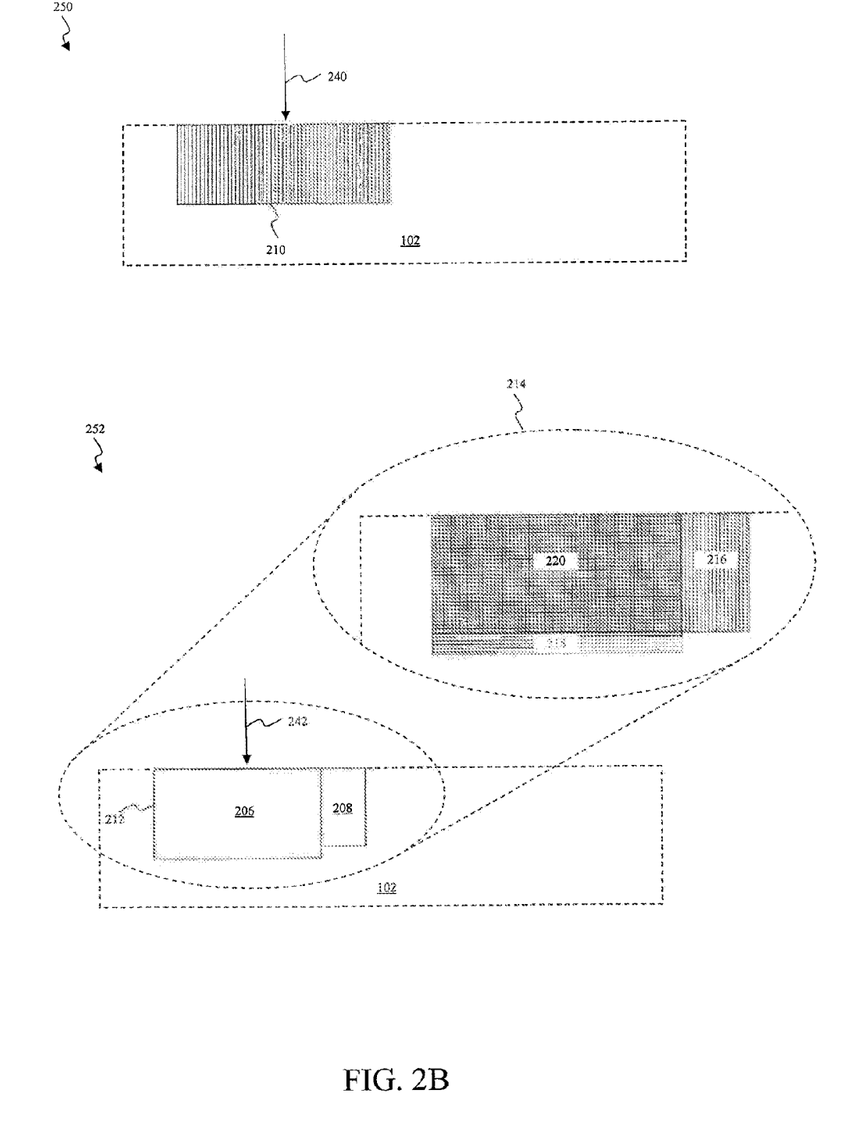
FIG. 2B illustrates fabrication processes of the CMOS logic foundry technology to fabricate an enhanced p-well region of the n-type LDMOS structure according to an exemplary embodiment of the present invention.

FIG. 2B illustrates fabrication processes of the CMOS logic foundry technology to fabricate an enhanced p-well region of the n-type LDMOS structure according to an exemplary embodiment of the present invention. The CMOS logic foundry technology fabricates the enhanced p-well region 202 using both the low operating voltage process and the high operating voltage process.

The CMOS logic foundry technology implants a first region 210 of the substrate 102 using a first high energy implant 240 having a first doping density at a fabrication process step 250. In an exemplary embodiment, the first high energy implant is substantially similar to a high energy implant used by the low operating voltage process of the conventional CMOS logic foundry technology.

The CMOS logic foundry technology implants a second region 212 of the substrate 102 using a second high energy implant 242 having a second doping density at a fabrication process step 252. The CMOS logic foundry technology may implant the second region 212 before or after the formation of the first region 210. Preferably, the second doping density of the second high energy implant 242 is greater than the first doping density of the first high energy implant 240; however, the second doping density of the second high energy implant 242 may be less than or equal to the first doping density of the first high energy implant 240. In an exemplary embodiment, the second high energy implant 242 is substantially similar to a high energy implant used by the high operating voltage process of the conventional CMOS logic foundry technology.

As shown in an exploded view 214 of FIG. 2B, implanting the first region 210 and the second region 212 using the first high energy implant 240 and the second high energy implant 242, respectively, forms the enhanced p-well region 202. As a result, the enhanced p-well region 202 may be characterized by multiple implanted regions, each of the multiple implanted regions having a different doping density. A first implant region 216 of the enhanced p-well region 202 may be characterized as including a first doping density corresponding to the first doping density of the first high energy implant 240. A second implant region 218 of the enhanced p-well region 202 may be characterized as including a second doping density corresponding to the second doping density of the second high energy implant 242. A third implant region 220 of the enhanced p-well region 202 may be characterized as including a third doping density corresponding to a combination of the first doping density of the first high energy implant 240 and the second doping density of the second high energy implant 242. The third implant region 220 represents a region in the enhanced p-well region 202 where the first high energy implant 240 and the second high energy 242 implant overlap.

It should be noted that the first p-well region 206, as discussed above, includes the second implant region 218 and the third implant region 220. Likewise, the second p-well region portion 208, as discussed above, includes the first implant region 216. It should also be noted that the height $h_1$ of the first p-well region portion 206 and the height $h_2$ of the second p-well region portion 208 may be substantially similar. In this situation, the first p-well region portion 206 only includes the third implant region 220.

Doping Profiles of an Enhanced P-Well Region of the N-Type LDMOS Structure

Figure 2C:
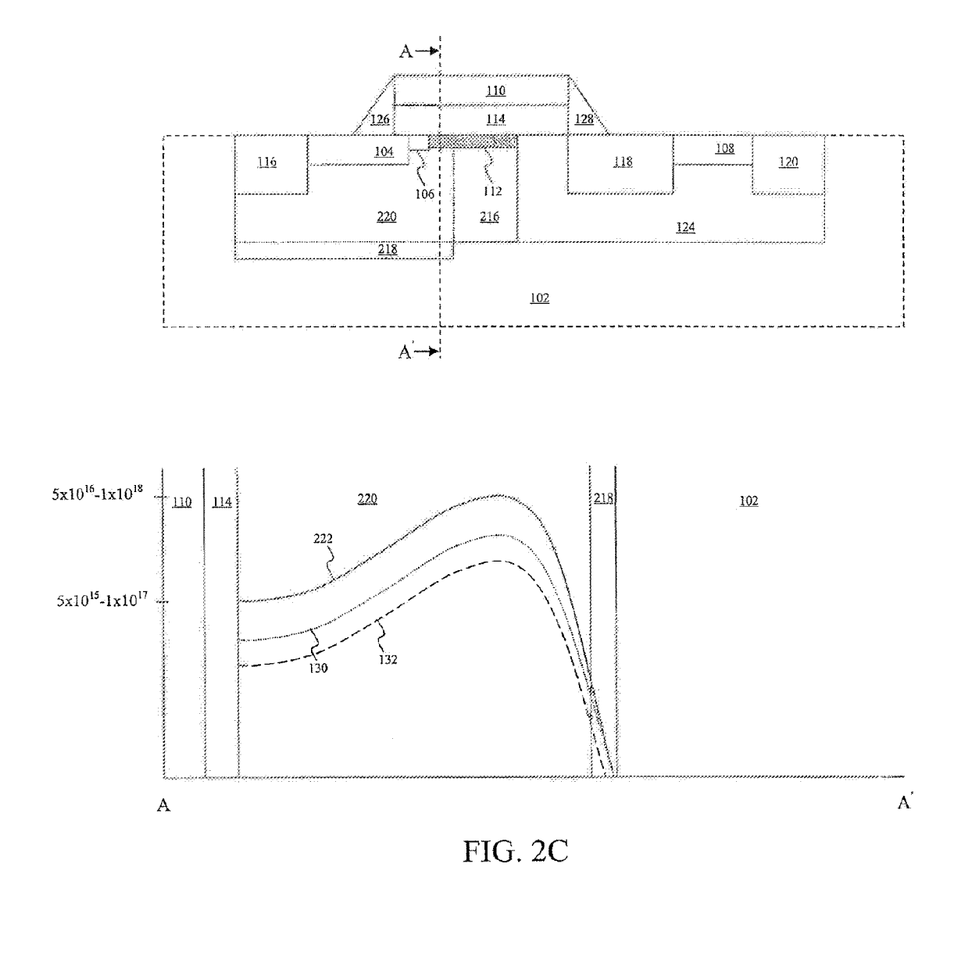
FIG. 2C illustrates a first doping profile of the enhanced p-well region according a first exemplary embodiment of the present invention.

FIG. 2C illustrates a first doping profile of the enhanced p-well region according a first exemplary embodiment of the present invention. In particular, FIG. 2C illustrates a doping profile 222 of the enhanced p-well region 202 along a cross section of the n-type LDMOS structure 200 as designated by the broken line A-A'. As shown in FIG. 2C, the broken line A-A' passes through the gate region 110, the gate oxide 114, the second implant region 218 of the enhanced p-well region 202, the third implant region 220 of the enhanced p-well region 202, and the substrate 102.

The doping profile 222 is greater than the doping profile 130 and the doping profile 132 in the third region 220. In this region, the doping profile 222 may be characterized by a doping density between a first range of approximately $$\frac{5 \times 10^{15} \text{ atoms}}{\text{cm}^3} \text{ to } \frac{1 \times 10^{17} \text{ atoms}}{\text{cm}^3}$$

to a second range of approximately $$\frac{5 \times 10^{16} \text{ atoms}}{\text{cm}^3} \text{ to } \frac{5 \times 10^{18} \text{ atoms}}{\text{cm}^3}.$$

The doping profile 222 converges with the doping profile 130 in the second implant region 218.

Figure 2D:
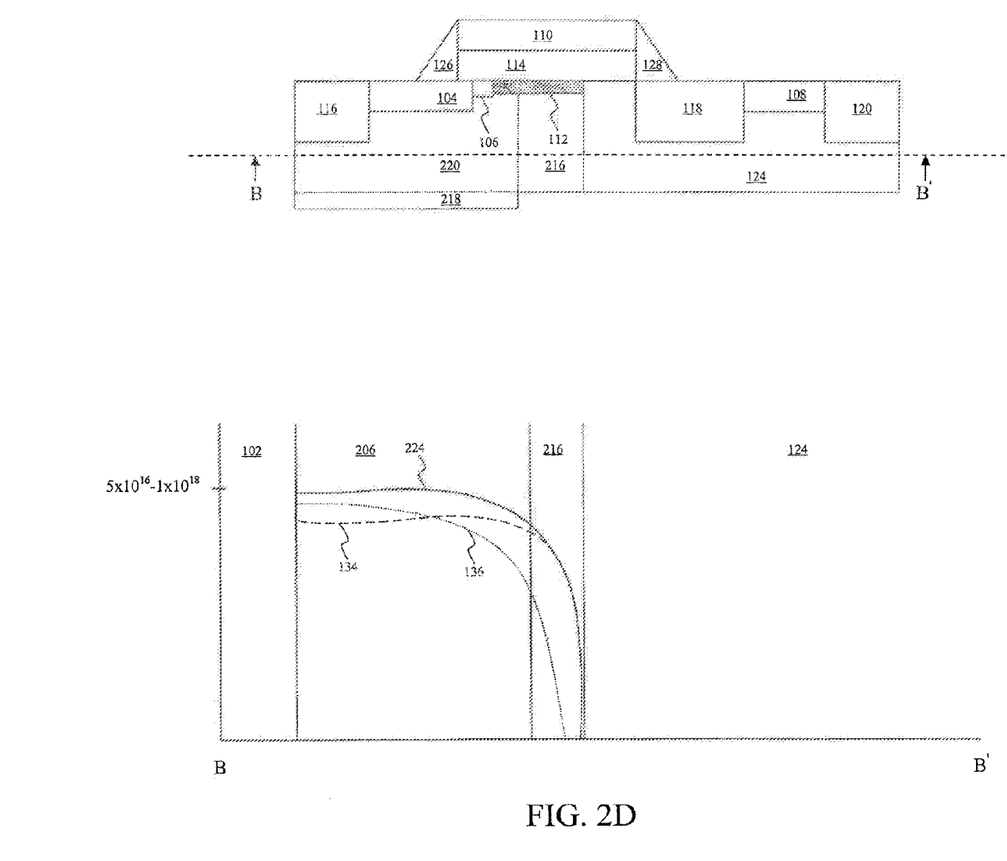
FIG. 2D illustrates a second doping profile of the enhanced p-well region according a second exemplary embodiment of the present invention.

FIG. 2D illustrates a second doping profile of the enhanced p-well region according a second exemplary embodiment of the present invention. In particular, FIG. 2D illustrates a doping profile 224 of the enhanced p-well region 202 along a cross section of the n-type LDMOS structure 200 as designated by the broken line B-B'. As shown in FIG. 2D, the broken line B-B' passes through the substrate 102, the first implant region 216 of the enhanced p-well region 202, the third implant region 220 of the enhanced p-well region 202, and the n-well region 124.

The doping profile 224 of the enhanced p-well region 202 is greater than the doping profile 134 and the doping profile 136 in the third region 220. In this region, the doping profile 224 may be characterized by a peak doping density between approximately $$\frac{5 \times 10^{16} \text{ atoms}}{\text{cm}^3}$$

and approximately $$\frac{1 \times 10^{18} \text{ atoms}}{\text{cm}^3}.$$

The doping profile 224 converges the doping profile 134 in the first implant region 216.

Breakdown Voltage of the N-Type LDMOS Structure

From the discussion above, the n-type LDMOS structure 200 may be characterized as including a higher voltage at which punch-through occurs when compared to the conventional. LDMOS structure 100. In particular, the enhanced p-well region 202 includes a greater number of excess carrier holes when compared to the p-well region 122 of the conventional LDMOS structure 100. These larger number of carrier holes allow for a higher voltage to be applied to the drain region 108 before the depletion region of the n-well region 124 and the depletion of the enhanced p-well region 202 merge into a single depletion region. As a result, the breakdown voltage of the n-type LDMOS structure 200 is higher than the breakdown voltage of the conventional LDMOS structure 100.

CONCLUSION

Although the LDMOS structures of the present invention have been described as n-type structures those skilled in the relevant art(s) will recognize that p-type structures may be similarly formed by using p-type material instead of n-type material without departing from the spirit and scope of the present invention. These p-type structures may be implanted into a deep n-well region formed within a p-type semiconductor substrate and/or directly implanted into an n-type semiconductor substrate. Additionally, those skilled in the relevant art(s) will recognize that the substrate as described herein may be composed of n-type material without departing from the spirit and scope of the present invention. In this situation, the LDMOS structures of the present invention may be implanted into a deep p-well region formed within the n-type semiconductor substrate.

While various embodiments of the present invention have been described above, it should be understood that they have been presented by way of example, and not limitation. It will be apparent to persons skilled in the relevant art(s) that various changes in form and detail may be made therein without departing from the spirit and scope of the invention. Thus the present invention should not be limited by any of the above-described exemplary embodiments, but should be defined only in accordance with the following claims and their equivalents.

What is claimed is:

1. A method of fabricating a metal oxide silicon (MOS) field effect transistor device on a semiconductor substrate, comprising:
    forming a source region on the semiconductor substrate;
    forming a drain region on the semiconductor substrate;
    forming a gate region on the semiconductor substrate between the source region and the drain region;
    forming a first well region portion having a first doping density on the semiconductor substrate with a first energy implant; and
    forming a second well region portion having a second doping density to overlap the first well region portion on the semiconductor substrate with a second energy implant to form a plurality of implanted regions, the plurality of implanted regions including a first implant region having the first doping density, a second implant region having the second doping density, and a third implant region having a third doping density that is a combination of the first and the second doping densities.

2. The method of claim 1, wherein the forming of the first well region portion comprises:
    forming the first well region portion with the first energy implant associated with a low operating voltage complementary metal oxide semiconductor (CMOS) logic foundry technology,
    wherein the forming of the second well region portion comprises:
    forming the second well region portion with the second energy implant associated with a high operating voltage CMOS logic foundry technology, and
    wherein the low operating voltage CMOS logic foundry technology corresponds to a lower operating voltage than the high operating voltage CMOS logic foundry technology.

3. The method of claim 1, wherein the forming of the second well region portion comprises:
    forming the second well region portion with the second energy implant having the second doping density that is greater than or equal to the first doping density.

4. The method of claim 1, wherein the forming of the first well region portion comprises:
    forming the semiconductor substrate with the first energy implant to form the first well region portion having a first height and a first width, and
    wherein the forming of the second well region portion comprises:
    forming the semiconductor substrate with the second energy implant to form the second well region portion having a second height that is greater than or equal to the first height and a second width.

5. The method of claim 1, wherein the forming of the first well region portion comprises:
    forming the semiconductor substrate with the first energy implant to form the first well region portion having a first height and a first width, and
    wherein the forming of the second well region portion comprises:
    forming the semiconductor substrate with the second energy implant to form the second well region portion having a second height that is less than the first height and a second width.

6. The method of claim 1, wherein the forming of the first well region portion comprises:
    forming the semiconductor substrate with the first energy implant to form the first well region portion having a first height and a first width, and wherein the forming of the second well region portion comprises:

forming the semiconductor substrate with the second energy implant to form the second well region portion having a second height and a second width that is greater than or equal to the first width.

7. The method of claim 1, wherein the forming of the first well region portion comprises:

forming the semiconductor substrate with the first energy implant to form the first well region portion having a first height and a first width, and wherein the forming of the second well region portion comprises:

forming the semiconductor substrate with the second energy implant to form the second well region portion having a second height that is less than the first height and a second width that is less than the first width.

8. The method of claim 1, further comprising:

selecting a ratio of a distance A to a distance B to be between:

$$0.2 < \frac{A}{B} \leq 1,$$

wherein the forming of the first well region portion comprises:

forming the first well region portion at the distance A from the source region, and wherein the forming of the second well region portion comprises:

forming the second well region portion at the distance B from the source region.

9. A method of fabricating a well region for a metal oxide silicon (MOS) field effect transistor device on a semiconductor substrate, comprising:

forming a first well region portion having a first doping density on the semiconductor substrate with a first energy implant; and forming a second well region portion having a second doping density to overlap the first well region portion on the semiconductor substrate with a second energy implant to form a plurality of implanted regions, the plurality of implanted regions including a first implant region having the first doping density, a second implant region having the second doping density, and a third implant region having a third doping density that is a combination of the first and the second doping densities.

10. The method of claim 9, wherein the forming of the first well region portion comprises:

forming the first well region portion with the first energy implant associated with a low operating voltage complementary metal oxide semiconductor (CMOS) logic foundry technology, wherein the forming of the second well region portion comprises:

forming the second well region portion with the second energy implant associated with a high operating voltage CMOS logic foundry technology, and wherein the low operating voltage CMOS logic foundry technology corresponds to a lower operating voltage than the high operating voltage CMOS logic foundry technology.

11. The method of claim 9, wherein the forming of the second well region portion comprises:

forming the second well region portion with the second energy implant having the second doping density that is greater than or equal to the first doping density.

12. The method of claim 9, wherein the forming of the first well region portion comprises:

forming the semiconductor substrate with the first energy implant to form the first well region portion having a first height, and wherein the forming of the second well region portion comprises:

forming the semiconductor substrate with the second energy implant to form the second well region portion having a second height that is greater than or equal to the first height.

13. The method of claim 9, wherein the forming of the first well region portion comprises:

forming the semiconductor substrate with the first energy implant to form the first well region portion having a first height, and wherein the forming of the second well region portion comprises:

forming the semiconductor substrate with the second energy implant to form the second well region portion having a second height that is less than the first height.

14. A method of fabricating a metal oxide silicon (MOS) field effect transistor device on a semiconductor substrate, comprising:

forming a source region on the semiconductor substrate;

forming a drain region on the semiconductor substrate;

forming a gate region on the semiconductor substrate between the source region and the drain region;

forming a first implant region having a first doping density with a first energy implant; and forming a second implant region having a second doping density that overlaps the first implant region with a second energy implant, wherein the overlapping of the first implant region and the second implant region forms a third implant region having a third doping density, the third doping density being a combination of the first and the second doping densities.

15. The method of claim 14, wherein the forming of the first implant region comprises:

forming the first implant region with the first energy implant associated with a low operating voltage complementary metal oxide semiconductor (CMOS) logic foundry technology, wherein the forming of the second implant region comprises:

forming the second implant region with the second energy implant associated with a high operating voltage CMOS logic foundry technology, and wherein the low operating voltage CMOS logic foundry technology corresponds to a lower operating voltage than the high operating voltage CMOS logic foundry technology.

16. The method of claim 14, wherein the forming of the second implant region comprises:

forming the second implant region with the second energy implant having the second doping density that is greater than or equal to the first doping density.

17. The method of claim 14, wherein the forming of the first implant region comprises:

forming the semiconductor substrate with the first energy implant to form the first implant region having a first height and a first width, and wherein the forming of the second implant region comprises:

forming the semiconductor substrate with the second energy implant to form the second implant region having a second height that is greater than or equal to the first height and a second width.

18. The method of claim 14, wherein the forming of the first implant region comprises:

forming the semiconductor substrate with the first energy implant to form the first implant region having a first height and a first width, and wherein the forming of the second implant region comprises:

forming the semiconductor substrate with the second energy implant to form the second implant region having a second height that is less than the first height and a second width.

19. The method of claim 14, wherein the forming of the first implant region comprises:

forming the semiconductor substrate with the first energy implant to form the first implant region having a first height and a first width, and wherein the forming of the second implant region comprises:

forming the semiconductor substrate with the second energy implant to form the second implant region having a second height and a second width that is greater than or equal to the first width.

20. The method of claim 14, wherein the forming of the first implant region comprises:

forming the semiconductor substrate with the first energy implant to form the first implant region having a first height and a first width, and wherein the forming of the second implant region comprises:

forming the semiconductor substrate with the second energy implant to form the second implant region having a second height that is less than the first height and a second width that is less than the first width.

\* \* \* \* \*